United States Patent [19]

Gentle

[11] Patent Number: 5,165,955
[45] Date of Patent: Nov. 24, 1992

[54] METHOD OF DEPOSITING A COATING CONTAINING SILICON AND OXYGEN

[75] Inventor: Theresa E. Gentle, Midland, Mich.

[73] Assignee: Dow Corning Corporation, Midland, Mich.

[21] Appl. No.: 706,464

[22] Filed: May 28, 1991

[51] Int. Cl.$^5$ ............................................. B05D 3/06
[52] U.S. Cl. ...................................... 427/575; 427/58; 427/255.3; 427/255.7; 427/402; 427/577; 427/578
[58] Field of Search ................. 427/38, 45.1, 58, 402, 427/255.3, 255.7

[56] References Cited

U.S. PATENT DOCUMENTS 3,615,272 10/1971 Collins et al. .......................... 23/366
4,756,977 7/1988 Haluska et al. ...................... 428/704

Primary Examiner—Bernard Pianalto

[57] ABSTRACT

The present invention relates to the deposition of coatings containing silicon and oxygen from vaporized hydrogen silsesquioxane resin. The process comprises introducing the hydrogen silsesquioxane vapor into a deposition chamber containing the substrate to be coated and then inducing reaction of the vapor to form the coating.

12 Claims, No Drawings

METHOD OF DEPOSITING A COATING CONTAINING SILICON AND OXYGEN

BACKGROUND

The present invention relates to the deposition of a coating containing silicon and oxygen from vaporized hydrogen silsesquioxane resin. The process comprises introducing the hydrogen silsesquioxane vapor into a deposition chamber containing the substrate to be coated and then inducing reaction of the vapor to form the coating.

Numerous silica vapor deposition methods are known in the art and many are currently used in industry. Typically, such deposition methods involve decomposing a silicon source in the presence of oxygen and the substrate to be coated. For example, chemical vapor deposition (CVD) is used to decompose various silanes (e.g., $SiH_4$, $H_2SiCl_2$, etc.) in the presence of a source of oxygen (e.g., air, oxygen, ozone, $NO_2$, etc.) for the deposition of protective or dielectric coatings.

Hydrogen silsesquioxane resin is likewise known in the art. For instance, Collins et al, in U.S. Pat. No. 3,615,272 describe such resins and their method of manufacture. Similarly, Haluska et al, in U.S. Pat. No. 4,756,977 teach the use of hydrogen silsesquioxane resin to form ceramic coatings on substrates. These patents, however, only describe the use of the resin in solution.

U.S. Pat. No. 5,063,267 assigned to the same assignee hereof, describes fractionating hydrogen silsesquioxane resin into narrow molecular weight fractions. The application describes the low molecular weight fractions thereof as volatile but does not describe a utility for such materials.

The present inventor has now unexpectedly discovered that gaseous, low molecular weight hydrogen silsesquioxane can be used in conventional vapor deposition techniques to form silicon and oxygen containing coatings.

SUMMARY OF THE INVENTION

The present invention relates to a method of depositing a coating containing silicon and oxygen on a substrate. The method comprises introducing a gas comprising hydrogen silsesquioxane into a deposition chamber containing the substrate. Reaction of the gas is then induced to form the coating.

DETAILED DESCRIPTION OF THE INVENTION

The present invention is based on the discovery that volatile fractions of hydrogen silsesquioxane resin can be used to form coatings on various substrates. The coatings produced by the techniques described herein are valuable as protective and dielectric layers on substrates such as electronic devices.

The term hydrogen silsesquioxane resin or H-resin is used in this application to describe various hydridosilane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Though not represented by this structure, these resins may contain a small number of silicon atoms which have either 0 or 2 hydrogen atoms attached thereto due to various factors involved in their formation or handling.

The above hydridosilane resins are generally produced by a process comprising the hydrolysis and condensation of silanes of the formula $HSiX_3$, wherein X is a hydrolyzable group. These reactions may result in a fully condensed $(HSiO_{3/2})_n$ resin or the hydrolysis and/or condensation may be interrupted at an intermediate point such that partial hydrolyzates (containing Si—OR groups) and/or partial condensates (containing SiOH groups) are formed.

Various methods for the production of H-resin have been developed. For instance, Collins et al, in U. S. Pat. No. 3,615,272, which is incorporated herein by reference, describe a process of forming nearly fully condensed H-resin (which may contain up to 100-300 ppm silanol) comprising hydrolyzing trichlorosilane in a benzenesulfonic acid hydrate hydrolysis medium and then washing the resultant resin with water or aqueous sulfuric acid. Similarly, Bank et al, in U.S. Pat. No. 5,010,159, which is hereby incorporated by reference, teach methods of forming such resins comprising hydrolyzing hydridosilanes in an arylsulfonic acid hydrate hydrolysis medium to form a resin which is then contacted with a neutralizing agent. A preferred embodiment of this latter process uses an acid to silane ratio of about 6/1.

Other resins, such as those described by Frye et al, in U.S. Pat. No. 4,999,397, hereby incorporated by reference, those produced by hydrolyzing an alkoxy or acyloxy silane in an acidic, alcoholic hydrolysis medium or any other equivalent hydridosilane, are also functional herein.

The above soluble hydridosilane resins are then fractionated to obtain the low molecular weight species which can be volatilized in the deposition process of this invention. Any conventional technique for fractionating the polymer can be used herein. Particularly preferred, however, is the use of a variety of fluids at, near or above their critical point. This process is described in U.S. Pat. No. 5,063,267, assigned to the same assignee hereof, and is hereby incorporated by reference. The process described therein comprises (1) contacting the H-resin with a fluid at, near or above its critical point for a time sufficient to dissolve a fraction of the polymer; (2) separating the fluid containing the fraction from the residual polymer; and (3) recovering the desired fraction.

Specifically, the application describes charging an extraction vessel with a sample of H-resin and then passing an extraction fluid through the vessel. The extraction fluid and its solubility characteristics are controlled so that only the desired molecular weight fractions of H-resin are dissolved. The solution with the desired fractions of H-resin is then removed from the vessel leaving those H-resin fractions not soluble in the fluid as well as any other insoluble materials such as gels or contaminants.

The desired H-resin fraction is then recovered from the solution by altering the solubility characteristics of the solvent and, thereby, precipitating out the desired fraction. These precipitates are then merely collected in a separation chamber by a process such as simple filtration.

The extraction fluid used in this process includes any compound which, when at, near or above its critical point, will dissolve the fraction of H-resin desired and not dissolve the remaining fractions. Additional consideration, however, is usually given to the critical temperature and pressure of the solvent compound so that unreasonable measures are not necessary to reach the appropriate point. Examples of specific compounds which are functional include, but are not limited to, carbon dioxide and most low molecular weight hydrocarbons such as ethane or propane.

By such methods, one can recover the desired fraction of H-resin. Other equivalent methods, however, which result in obtaining the fractions described herein are also contemplated. For instance, methods such as solution fractionation or sublimation may also function herein.

The preferred fraction of H-resin to be used in the process of this invention is one which can be volatilized under moderate temperature and/or vacuum conditions. Generally, such fractions are those in which at least about 75% of the species have a molecular weight less than about 2000. Preferred herein, however, are those fractions in which at least about 75% of the species have a molecular weight less than about 1200. with those fractions in which at least about 75% of the species have a molecular weight between about 400 and 1000 (T8-T16) being particularly preferred. Additionally, it is contemplated that broad molecular weight materials may be used herein as the source of H-resin vapor. Volatilization of such material, however, often leaves a residue comprising nonvolatile species.

Once the desired fraction of H-resin is obtained, it is vaporized and introduced into a deposition chamber containing the substrate to be coated. Vaporization may be accomplished by heating the H-resin sample above its vaporization point, by the use of vacuum, or by a combination of the above. Generally, vaporization may be accomplished at temperatures in the range of 50-300° C. under atmospheric pressure or at lower temperature (near room temperature) under vacuum.

The amount of H-resin vapor used in the process of this invention is that which is sufficient to deposit the desired coating. This can vary over a wide range depending on factors such as the desired coating thickness, the area to be coated, etc. In addition, the vapor may be used at nearly any concentration desired. If dilute vapor is to be used, it may be combined with nearly any compatible gas such as air argon or helium.

The vaporized H-resin is then reacted to deposit the coating on the substrate. Reaction of gaseous species is well known in the art and any conventional chemical vapor deposition (CVD) technique can be used herein. For example, methods such as simple thermal vapor deposition, photothermal vapor deposition, plasma enhanced chemical vapor deposition (PECVD). electron cyclotron resonance (ECR). jet vapor deposition, or any similar technique may be used. These processes involve the addition of energy (in the form of heat, plasma, etc.) to the vaporized species to cause the desired reaction.

In thermal vapor deposition, the coating is deposited by passing a stream of the vaporized H-resin over a heated substrate. When the H-resin vapor contacts the hot surface, it reacts and deposits the coating. Substrate temperatures in the range of about 100-1000° C. are sufficient to form these coatings in several minutes to several hours, depending on the thickness desired. It is to be noted that environments which facilitate the desired deposition can also be used in the deposition chamber. For instance, reactive environments such as air, oxygen, oxygen plasma, ammonia, amines, etc. or inert environments may all be used herein.

In PECVD. the vaporized H-resin is reacted by passing it through a plasma field. The reactive species thereby formed are then focused at the substrate and readily adhere. Generally, the advantage of this process over thermal CVD is that lower substrate temperature can be used. For instance, substrate temperatures of about 20° up to about 600° C. are functional.

The plasmas used in such processes comprise energy derived from a variety of sources such as electric discharges, electromagnetic fields in the radio-frequency or microwave range, lasers or particle beams. Generally preferred in most plasma deposition processes is the use of radio frequency (10 kHz–$10^2$ MHz) or microwave (0.1–10 GHz) energy at moderate power densities (0.1–5 watts/$cm^2$). The specific frequency, power and pressure, however, are generally tailored to the equipment.

Although the mechanism for this deposition is not clearly understood, it is postulated that the addition of energy to the vaporized H-resin induces reaction with oxygen and causes some rearrangement of the molecules so that a silicon and oxygen containing coating is formed on the substrate. These coatings generally comprise primarily silica, but they may also contain silicon suboxides, and residual Si—OC and/or Si—OH.

The process of this invention can be used to deposit desirable coatings in a wide variety of thicknesses. For instance, coatings in the range of from about a monolayer to greater than about 2-3 microns are possible. These coating may also be covered by other coatings such as further $SiO_2$ coatings, $SiO_2$/modifying ceramic oxide layers, silicon containing coatings, silicon carbon containing coatings, silicon nitrogen containing coatings, silicon nitrogen carbon containing coatings, silicon oxygen nitrogen containing coatings, and/or diamond like carbon coatings. Such coatings and their mechanism of deposition are known in the art. Many are taught in U.S. Pat. No. 4,973.526, which is incorporated herein by reference.

The choice of substrates to be coated is limited only by the need for thermal and chemical stability at the temperature and in the environment of the deposition vessel. Thus, the substrate can be, for example, glass, metal, plastic, ceramic or the like. It is particularly preferred herein, however, to coat electronic devices to provide a protective or dielectric coating.

The following non-limiting example is provided to illustrate the invention to those skilled in the art.

EXAMPLE 1

Hydrogen silsesquioxane resin made by the method of Bank et al., U.S. Pat. No. 5.010.159, was fractionated using the process of Example 1 in U.S. patent application 07/618.865 and a fraction with a Mw Peak=437, Mn=361, Mw=414, Mz=459 and D=1.14 was collected.

The H-resin fraction was placed at one end of a tube furnace and a silicon wafer placed at the other end. 2 temperature zones were then established in the furnace - a zone of about 100°-200° C. at the H-resin end and a zone of about 325°-415° C. at the wafer end. A flow of air was established through the furnace from the end which held the H-resin to the end which held the wafer. By this process, any H resin which was volatilized in the low temperature zone was carried to the high temperature zone where it reacted and was deposited on the heated silicon wafer. The air flow was maintained for about 10 minutes. After the air flow was stopped, the furnace was cooled and the wafer removed.

Examination of the wafer showed that a thin coating had been deposited. FTIR analysis of the coating showed the typical silica band at 1062 cm$^{-1}$.

That which is claimed is:

1. A method of depositing a coating containing silicon and oxygen on a substrate comprising:

introducing a gas comprising hydrogen silsesquioxane into a deposition chamber containing the substrate; and inducing reaction of the hydrogen silsesquioxane by the addition of energy to form the coating.

2. The method of claim 1 wherein the hydrogen silsesquioxane comprises a sample in which greater than about 75% of the species have a molecular weight less than about 2000.

3. The method of claim 2 wherein the hydrogen silsesquioxane comprises a sample in which greater than about 75% of the species have a molecular weight less than about 1200.

4. The method of claim 3 wherein the hydrogen silsesquioxane comprises a sample in which greater than about 75% of the species have a molecular weight between about 400 and about 1000.

5. The method of claim 1 wherein the hydrogen silsesquioxane is diluted in a carrier gas.

6. The method of claim 1 wherein the hydrogen silsesquioxane is induced to react by exposure to an elevated temperature.

7. The method of claim 6 in which the temperature is in the range of about 100°-1000° C.

8. The method of claim 1 wherein the hydrogen silsesquioxane resin is induced to react by exposure to a plasma.

9. The method of claim 8 in which the plasma comprises radio frequency energy or microwave energy.

10. The method of claim 1 in which the deposition chamber contains a reactive environment selected from the group consisting of air, oxygen, oxygen plasma, ammonia, and amines.

11. The method of claim 1 in which the substrate comprises an electronic device.

12. The method of claim 1 additionally comprising applying coatings selected from the group consisting of $SiO_2$ coatings. $SiO_2$/modifying ceramic oxide layers, silicon containing coatings, silicon carbon containing coatings, silicon nitrogen containing coatings, silicon nitrogen carbon containing coatings, silicon oxygen nitrogen containing coatings, and diamond like carbon coatings on the coated substrate.

* * * * *